US009653292B2

(12) United States Patent
Bae et al.

(10) Patent No.: US 9,653,292 B2
(45) Date of Patent: May 16, 2017

(54) METHOD OF MANUFACTURING THIN FILM TRANSISTOR SUBSTRATE, METHOD OF MANUFACTURING DISPLAY APPARATUS, THIN FILM TRANSISTOR SUBSTRATE, AND DISPLAY APPARATUS

(71) Applicant: SAMSUNG DISPLAY CO., LTD., Yongin, Gyeonggi-Do (KR)

(72) Inventors: Joonhwa Bae, Yongin (KR); Yoonho Khang, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/568,309

(22) Filed: Dec. 12, 2014

(65) Prior Publication Data

US 2016/0005600 A1    Jan. 7, 2016

(30) Foreign Application Priority Data

Jul. 4, 2014  (KR) .................. 10-2014-0083897

(51) Int. Cl.
*H01L 21/02* (2006.01)
*H01L 29/786* (2006.01)
*H01L 27/12* (2006.01)

(52) U.S. Cl.
CPC .. *H01L 21/02675* (2013.01); *H01L 21/02422* (2013.01); *H01L 21/02532* (2013.01); *H01L 21/02691* (2013.01); *H01L 27/1222* (2013.01); *H01L 29/7866* (2013.01)

(58) Field of Classification Search
CPC ......... H01L 21/02675; H01L 21/02691; H01L 21/02667; H01L 27/1285; H01L 31/1872; H01L 33/0095
See application file for complete search history.

(56) References Cited

U.S. PATENT DOCUMENTS

| 6,136,632 | A | 10/2000 | Higashi | |
|---|---|---|---|---|
| 7,651,928 | B2* | 1/2010 | Fujino | H01L 21/02532 |
| | | | | 257/E21.461 |
| 7,655,950 | B2 | 2/2010 | Sato et al. | |
| 8,043,905 | B2 | 10/2011 | Hayakawa | |
| 2005/0073472 | A1 | 4/2005 | Kim et al. | |
| 2008/0233689 | A1 | 9/2008 | Moriwaka | |

(Continued)

FOREIGN PATENT DOCUMENTS

| JP | 2003-218362 A | 7/2003 |
|---|---|---|
| JP | 2004-349415 A | 12/2004 |

(Continued)

OTHER PUBLICATIONS

WO 2013/051221 A1; as originally published in Japanese.*

*Primary Examiner* — Daniel Whalen
*Assistant Examiner* — Suberr Chi
(74) *Attorney, Agent, or Firm* — Lee & Morse P.C.

(57) ABSTRACT

A method of manufacturing a thin film transistor substrate includes forming an amorphous silicon layer on a substrate, the substrate having a rectangular shape, and irradiating the amorphous silicon layer with a laser beam at a random pitch, such that the amorphous silicon layer is crystallizes into a polycrystalline silicon layer, wherein the laser beam has a major axis and a minor axis, the major axis being non-parallel with respect to sides of the substrate.

4 Claims, 3 Drawing Sheets

(56) References Cited

U.S. PATENT DOCUMENTS

2011/0223775 A1* 9/2011 Chung .............. H01L 21/02532
438/795
2014/0231813 A1* 8/2014 Oda .................. H01L 21/02532
257/66

FOREIGN PATENT DOCUMENTS

JP     2008-270779 A    11/2006
KR     10-0514417 B1     9/2005

* cited by examiner

METHOD OF MANUFACTURING THIN FILM TRANSISTOR SUBSTRATE, METHOD OF MANUFACTURING DISPLAY APPARATUS, THIN FILM TRANSISTOR SUBSTRATE, AND DISPLAY APPARATUS

CROSS-REFERENCE TO RELATED APPLICATION

Korean Patent Application No. 10-2014-0083897, filed on Jul. 4, 2014, in the Korean Intellectual Property Office, and entitled: "Method of Manufacturing Thin Film Transistor Substrate, Method of Manufacturing Display Apparatus, Thin Film Transistor Substrate, and Display Apparatus," is incorporated by reference herein in its entirety.

BACKGROUND

1. Field

One or more embodiments relate to a method of manufacturing a thin film transistor substrate, a method of manufacturing a display apparatus, a thin film transistor substrate, and a display apparatus. More particularly, one or more embodiments relate to a method of manufacturing a thin film transistor substrate including a plurality of thin film transistors having uniform characteristics, a method of manufacturing a display apparatus, a thin film transistor substrate, and a display apparatus.

2. Description of the Related Art

In a display apparatus, e.g., an organic light-emitting display apparatus, a thin film transistor for controlling an operation of each pixel (sub-pixel) is generally provided on a substrate. Such a thin film transistor may include a semiconductor layer, a source electrode, a drain electrode, and a gate electrode. In this regard, the semiconductor layer may include a polycrystalline silicon formed by crystallization of amorphous silicon via irradiation thereof with a laser beam.

SUMMARY

According to one or more embodiments, a method of manufacturing a thin film transistor substrate includes forming an amorphous silicon layer on a substrate, the substrate having a rectangular shape, and irradiating the amorphous silicon layer with a laser beam at a random pitch, such that the amorphous silicon layer is crystallizes into a polycrystalline silicon layer, wherein the laser beam has a major axis and a minor axis, the major axis being non-parallel with respect to sides of the substrate.

The crystallizing may include moving a laser beam emission source in a direction in parallel to one of the sides of the substrate according to the random pitch.

The crystallizing may include moving the substrate in a direction in parallel to one of the sides of the substrate at the random pitch while a laser beam emission source is in a fixed state.

Irradiating the amorphous silicon layer with the laser beam at a random pitch may include having the laser beam move along first through nth straight lines, such that distances between adjacent ones of the first through nth straight lines define the random pitch, n being a natural number.

The first through nth straight lines may define a first edge of the laser beam at different positions relative to the substrate, the first through nth straight lines being non-parallel to sides of the substrate, and parallel to each other.

The method may further include patterning the polycrystalline silicon layer to form a plurality of islands spaced apart from each other, such that first islands among the plurality of islands that overlap the first through nth straight lines have different electrical characteristics relative to second islands among the plurality of islands that do not overlap the first through nth straight lines.

According to one or more embodiments, a method of manufacturing a display apparatus includes forming an amorphous silicon layer on a substrate, the substrate having a rectangular shape, irradiating the amorphous silicon layer with a laser beam at a random pitch, such that the amorphous silicon layer is crystallizes into a polycrystalline silicon layer, the laser beam having a major axis and a minor axis, and the major axis being non-parallel with respect to sides of the substrate, and forming a plurality of pixel electrodes corresponding to the polycrystalline silicon layer.

According to one or more embodiments of the present invention, a thin film transistor substrate includes a substrate; and a polycrystalline silicon layer disposed on the substrate and patterned as a plurality of islands, wherein if n is a natural number, and, among the plurality of islands, islands located on first through nth straight lines that are not parallel to sides of the substrate but are parallel among one another and have a random distance therebetween are first islands, and remaining islands are second islands, then electrical characteristics of the first islands are different from those of the second islands.

The electrical characteristics of the first islands and the second islands may be a threshold voltage of the thin film transistor substrate.

The electrical characteristics of the first islands and the second islands may be a mobility of the thin film transistor substrate.

According to one or more embodiments, a display apparatus includes a substrate, a patterned polycrystalline silicon layer on the substrate, the polycrystalline silicon layer including a plurality of islands, wherein, among the plurality of islands, islands located on first through nth straight lines are first islands, remaining islands are second islands, and electrical characteristics of the first islands are different from those of the second islands, and wherein n is a natural number, and first through nth straight lines are not parallel to sides of the substrate, are parallel to each other, and have a random distance therebetween.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
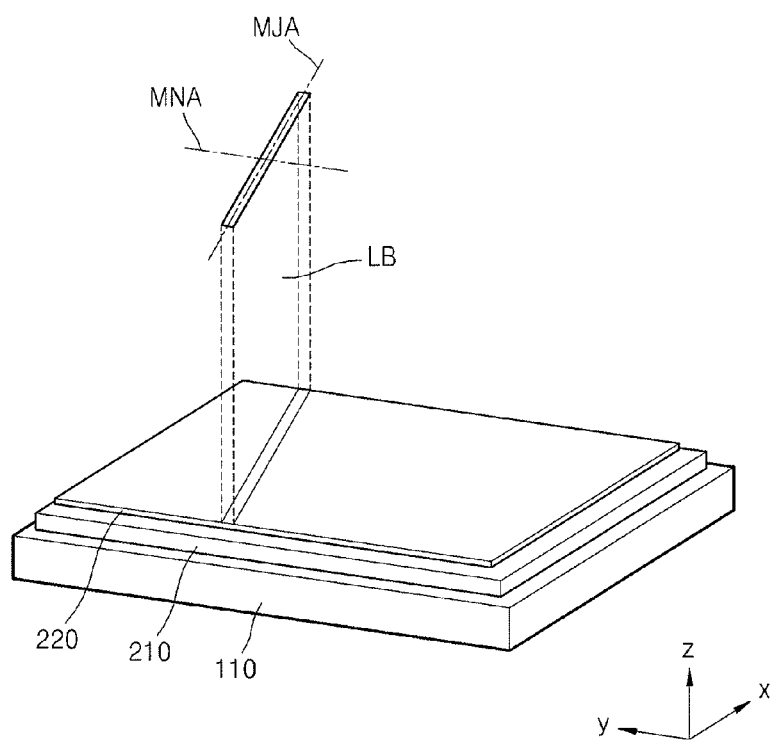
FIG. 1 illustrates a schematic perspective view for explaining a method of manufacturing a thin film transistor substrate according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. For example, since sizes and thicknesses of components in the drawings are illustrated for convenience of explanation, the following embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic perspective view for explaining a process of a method of manufacturing a thin film transistor substrate according to an embodiment.

Referring to FIG. 1, a substrate 210 is prepared. For example, the substrate 210 may have a rectangular shape. In this regard, the rectangular shape is a shape of the substrate 210 when the substrate 210 is viewed along an X-axis on a xy plane. The substrate 210 may also have a square shape when viewed along the X-axis on the xy plane. The substrate 210 may be formed of various materials, e.g., a glass material, a metal material, a plastic material, e.g., polyethylene terephthalate (PET), polyethylene naphthalate (PEN), polyimide, etc.

After the substrate 210 is prepared, an amorphous silicon layer 220 is formed on the substrate 210. Before forming the amorphous silicon layer 220, a buffer layer (not shown) may be formed on the substrate 210 by using, e.g., silicon oxide or silicon nitride, and then the amorphous silicon layer 220 may be formed on the buffer layer. The buffer layer may prevent impurities from penetrating into the amorphous silicon layer 220 or a polycrystalline semiconductor layer obtained by crystallizing the amorphous silicon layer 220. If necessary, an organic insulating material, e.g., PET, PEN, polyacrylate or polyimide, may be used as a material for forming the buffer layer.

After forming the amorphous silicon layer 220 on the substrate 210, the amorphous silicon layer 220 may be crystallized to form a polycrystalline silicon layer by irradiating the amorphous silicon layer 220 with a laser beam LB. As illustrated in FIG. 1, the laser beam LB has a major axis MJA and a minor axis MNA (both in the xy plane). Thus, when an entire surface of the amorphous silicon layer 220 or a considerable portion thereof is crystallized, the amorphous silicon layer 220 is irradiated with the laser beam LB several times by changing a location of the amorphous silicon layer 220 which is irradiated with the laser beam LB.

As illustrated in FIG. 1, the laser beam LB may be emitted such that the major axis MJA of the laser beam LB is non-parallel with sides, e.g., edges, of the substrate 210. In other words, if the sides, e.g., edges, of the substrate 210 are arranged along the x-axis and y-axis to define a rectangle, the major axis MJA of the laser beam LB may be non-parallel with the x-axis or the y-axis, e.g., the major axis MJA of the laser beam LB may be oriented at an oblique angle with respect to either of the x and y axes.

In addition, the amorphous silicon layer 220 is irradiated with the laser beam LB several times by changing a location of the amorphous silicon layer 220, so as to crystallize the entire surface of the amorphous silicon layer 220 or a considerable portion thereof. During the irradiation, the laser beam LB may be emitted according to a random pitch.

For example, as shown in FIG. 1, if the substrate 210, on which the amorphous silicon layer 220 is formed, is placed on a movable stage 110, and an emission source of the laser beam LB is at a fixed state, the stage 110 may be used to move the substrate 210 in a direction parallel to one of the sides of the substrate 210, e.g., along the x-axis or the y-axis, according to the random pitch. In another example, when a location of the substrate 210, on which the amorphous silicon layer 220 is formed, is in a fixed state, the emission source of the laser beam LB may be moved in the direction parallel to one of the sides of the substrate 210, e.g., along the x-axis or the y-axis, according to the random pitch. In either case, to crystallize the entire surface of the amorphous silicon layer 220 or a considerable portion thereof, the random pitch may be within a previously set range. For example, when the entire surface of the amorphous silicon layer 220 is irradiated with the laser beam LB, first and second shots of the laser beam LB may at least partially overlap with each other.

If the amorphous silicon layer 220 is crystallized as described above, when a plurality of thin film transistors are formed on the substrate 210 by using the crystallized amorphous silicon layer 220, the thin film transistors may have a uniform characteristic as a whole. This will be described in more detail below.

Figure 2:
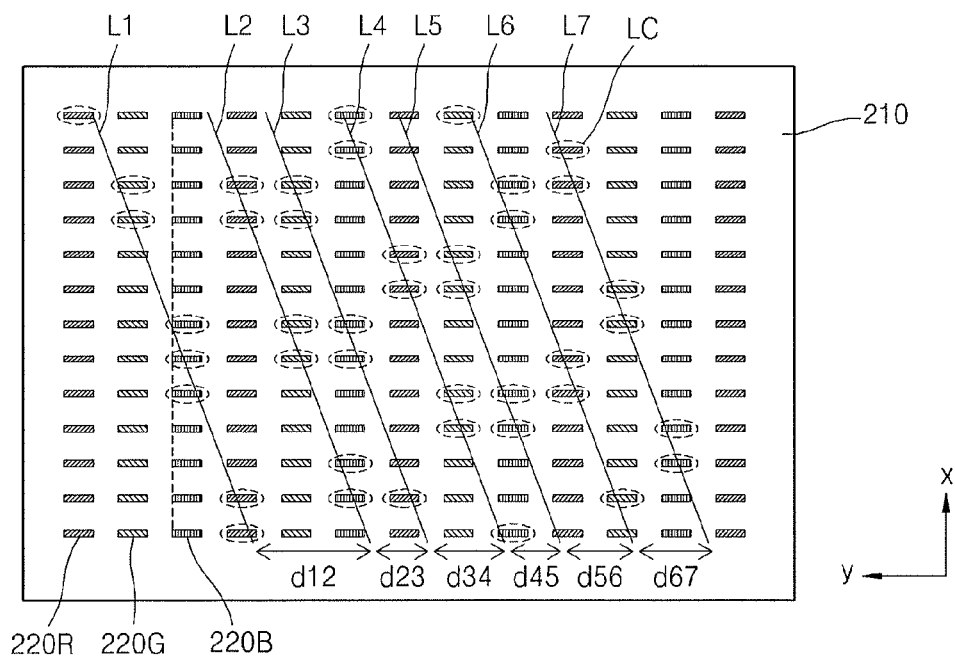
FIG. 2 illustrates a schematic plan diagram for explaining a characteristic of a thin film transistor substrate manufactured by the process of FIG. 1.

FIG. 2 is a schematic plan of a conceptual diagram for explaining a characteristic of the thin film transistor substrate manufactured by the process of FIG. 1.

Referring to FIG. 2, the amorphous silicon layer 220 on the substrate 210 may be crystallized by a laser to form a polycrystalline silicon layer. Next, an unnecessary part of the resultant polycrystalline silicon layer may be removed by patterning the polycrystalline silicon layer to form a plurality of islands. For example, islands 220R may be used as polycrystalline silicon layers of thin film transistors related to red sub-pixels, islands 220G may be used as polycrystalline silicon layers of thin film transistors related to green sub-pixels, and islands 220B may be used as polycrystalline silicon layers of thin film transistors related to blue sub-pixels in a display apparatus in the future.

In FIG. 2, straight lines L1 through L7 represent portions of the amorphous silicon layer 220 where edges of the laser beam LB are irradiated. It is noted that the distances between adjacent ones of the straight lines L1 through L7 is the pitch of the laser beam LB, which is not constant, i.e., distances between adjacent ones of the straight lines L1 through L7 are not equal to each other. For example, when the amorphous silicon layer 220 is irradiated with the laser beam LB, the laser beam LB may first be emitted such that a first edge of the laser beam LB is disposed along the straight line L1. Next, the laser beam LB may be emitted such that the first edge of the laser beam LB is disposed along the straight line L2 by moving the laser beam emission source or the location of the substrate 210 by a distance d12.

Similarly, the laser beam LB may be emitted such that one edge of the laser beam LB is disposed along the straight line L3 by moving the laser beam emission source or the location of the substrate 210 by a distance d23, the laser beam LB may be emitted such that one edge of the laser beam LB is disposed along the straight line L4 by moving the laser beam emission source or the location of the substrate 210 by a distance d34, the laser beam LB may be emitted such that one edge of the laser beam LB is disposed along the straight line L5 by moving the laser beam emission source or the location of the substrate 210 by a distance d45, the laser beam LB may be emitted such that one edge of the laser beam LB is disposed along the straight line L6 by moving the laser beam emission source or the location of the substrate 210 by a distance d56, and the laser beam LB may be emitted such that one edge of the laser beam LB is disposed along the straight line L7 by moving the laser beam emission source or the location of the substrate 210 by a distance d67. In this regard, the distances d12 through d67 may be random distances, e.g., distances d12 through d67 may be different from each other and not in any particular order or arrangement. It is further noted that lines L1 through L7 are parallel to each other.

When the laser beam LB is irradiated as described above, after patterning the polycrystalline silicon layer to form the plurality of islands 220R, 220G and 220B, the resultant islands disposed on the straight lines L1 through L7 have different electrical characteristics as compared to islands not overlapping the straight lines L1 through L7. Therefore, islands among the plurality of islands 220R, 220G, and 220B that are on, e.g., overlapping any portion of, the straight lines L1 through L7 are referred to as first islands LC (circled with a dashed line in FIG. 2), while islands among the plurality of islands 220R, 220G, and 220B that do not overlap the straight lines L1 through L7 are referred to as second islands. Accordingly, electrical characteristics of the first islands LC are different from those of the second islands. As such, when thin film transistors are formed by using the first islands LC having electrical characteristics different from those of the second islands, electrical characteristics of thin film transistors corresponding to the first islands LC are different from those of thin film transistors corresponding to the second islands.

When a thin film transistor substrate including a plurality of thin film transistors is used to manufacture various electronic apparatuses, if electrical characteristics of the plurality of thin film transistors throughout the substrate are not uniform, the quality of the electronic apparatuses may deteriorate. For example, if the thin film transistor substrate including the plurality of thin film transistors is used to manufacture an organic light-emitting display apparatus, emission levels of pixels (sub-pixels) may differ according to the electrical characteristics of the corresponding thin film transistors. That is, even if a same electrical signal is applied to all the thin film transistors in the thin film transistor substrate, the emission levels of pixels (sub-pixels) in thin film transistors having different electrical characteristics are different.

Considering the above, when polycrystalline silicon patterns (corresponding to thin film transistors) with different electrical characteristics are formed in repeated and uniform cycles on the thin film transistor substrate, e.g., if the polycrystalline silicon patterns are formed in an array with constant and uniform distances therebetween, thin film transistors including such polycrystalline silicon patterns are arranged in the organic light-emitting display apparatus in a constant and uniform pattern as well. Accordingly, pixels (sub-pixels) corresponding to the thin film transistors including such polycrystalline silicon patterns, and which emit light having a different brightness due to the different electrical characteristics, are arranged in the organic light-emitting display apparatus in a constant and uniform pattern.

However, the constant and uniform pattern of such differently lit pixels (sub-pixels) appears to a user at regular intervals, thereby increasing visibility of the differently lit pixels and deteriorates the quality of a displayed image.

Therefore, according to a method of manufacturing the thin film transistor substrate of the present embodiment, the first islands LC are randomly located, as shown in FIG. 2. That is, the first islands LC with the different electrical characteristics are randomly spread throughout the substrate 210, rather than being arranged at constant intervals. Thus, the organic light-emitting display apparatus with the randomly arranged first islands LC includes corresponding randomly arranged pixels (sub-pixels) that emit light having a brightness different than that intended by a user. Since the locations of such pixels (sub-pixels) are random, visibility of such pixels (sub-pixels) among the entirely of pixels is substantially reduced, e.g., as compared to visibility of uniformly arranged and differently lit pixels among the entirety of pixels. As such, the overall quality of the displayed image is not affected, which allows a user to recognize, e.g., optically perceive, a high quality image, despite the existence of the first islands LC.

As discussed previously, spaces, i.e., distance d12 through d67, between the straight lines L1 through L7 are random. If spaces between the straight lines L1 through L7 were not random but uniform, the locations of the first islands LC would have been uniform.

As discussed previously, the straight lines L1 through L7 are non-parallel with respect to the sides (x-axis or y-axis) of the substrate 210 spaces. If the straight lines L1 through L7 were parallel to sides (x-axis or y-axis) of the substrate 210, despite the random spaces between the straight lines L1 through L7, the first islands LC could have been on a straight line parallel to the x-axis or the y-axis. As such, the resultant first islands LC would have been uniform.

Therefore, according to the method of manufacturing the thin film transistor substrate of the present embodiment, the amorphous silicon layer 220 is crystallized into the polycrystalline silicon layer by irradiating the laser beam LB at a random pitch, while the major axis MJA of the laser beam LB is non parallel to the sides of the substrate 210. Accordingly, random locations of the first islands LC are effectively implemented.

Although only a semiconductor layer is described above, a process of patterning the polycrystalline silicon layer, forming a gate insulating layer to cover the patterned polycrystalline silicon layer by using silicon oxide, silicon nitride, or other insulating organic and inorganic materials, and forming a gate electrode on the gate insulating layer may be performed. A doping process of injecting ions into at least a part of the patterned polycrystalline silicon layer may also be performed. A process of forming an interlayer insulating layer on the gate insulating layer to cover the gate electrode by using silicon oxide, silicon nitride, or other insulating organic and inorganic materials, and forming contact holes in the interlayer insulating layer and/or the gate insulating layer to expose at least a part of a source area of the polycrystalline silicon layer and at least a part of a drain area thereof may be performed. A process of forming a source electrode and a drain electrode that contact the polycrystalline silicon layer through the contact holes may be performed.

Although a method of manufacturing a thin film transistor substrate is described above, embodiments are not limited thereto. For example, a thin film transistor substrate manufactured by using the exemplary method may also be within the scope of the embodiments.

For example, the thin film transistor substrate according to the present embodiment includes a substrate and a polycrystalline silicon layer patterned as a plurality of islands provided on the substrate. In this regard, when "n" is a natural number, and among the plurality of islands, islands that are not parallel to sides of the substrate but are reciprocally parallel and are located on first through nth straight lines having a random distance therebetween are the first islands LC, and remaining islands are second islands. Electrical characteristics of the first islands LC are different from those of the second islands. The first islands LC are randomly located on the substrate. In this regard, an electrical characteristic may be, e.g., a threshold voltage Vth of thin film transistors or mobility thereof.

The first islands LC are randomly located on the thin film transistor substrate, as described previously with reference to FIG. 2. Therefore, a user may be prevented from recognizing characteristics of the thin film transistors corresponding to the first islands LC.

Figure 3:
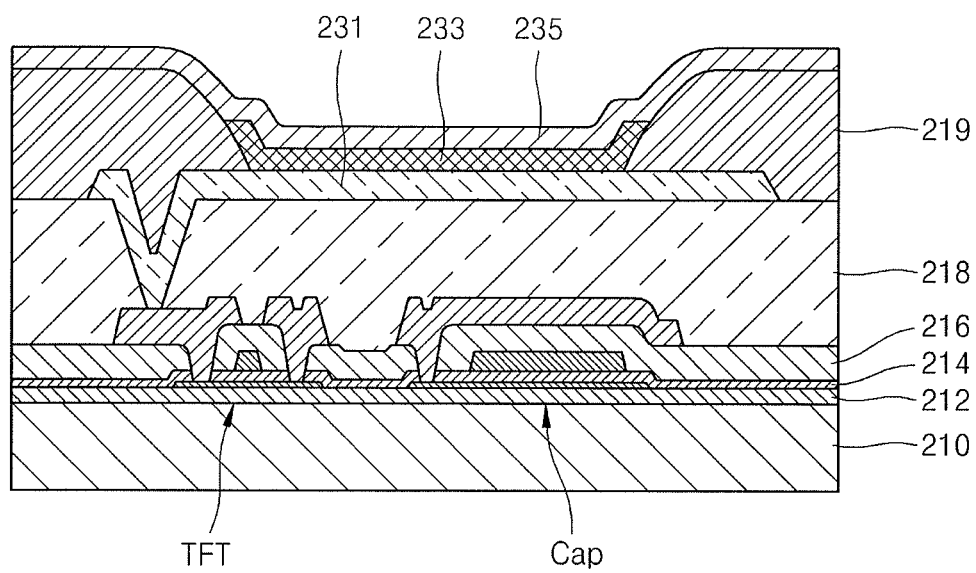
FIG. 3 illustrates a schematic cross-sectional view of an organic light-emitting display apparatus according to an embodiment.

In the meantime, a display apparatus including the thin film transistor is also within the scope of the embodiments. For example, the display apparatus according to an embodiment may include the thin film transistors described above and display devices electrically connected to the thin film transistors. FIG. 3 is a schematic cross-sectional view of a display apparatus, e.g., an organic light-emitting display apparatus, according to an embodiment.

Referring to FIG. 3, an organic light-emitting display apparatus according to the present embodiment may include the substrate 210, a thin film transistor TFT, a capacitor Cap, and an organic light-emitting device OLED, e.g., an organic light-emitting diode (OLED), that is a display device. The substrate 210 may be formed of a transparent material, e.g., a glass material, a plastic material, or a metal material.

A buffer layer 212, a gate insulating layer 214, and an interlayer insulating layer 216 may be formed on an entire surface of the substrate 210. The thin film transistor TFT may include a polycrystalline silicon layer, a gate electrode, a source electrode, and a drain electrode.

An insulating layer 218 that covers the thin film transistor TFT may be a protection layer that protects the thin film transistor TFT or a planarization layer having a planar top surface, and may have a multilayer structure formed of the protection layer and the planarization layer. The organic light-emitting device OLED including a patterned pixel electrode 231, a facing electrode 235 approximately corresponding to the entire surface of the substrate 210, and an intermediate layer 233 disposed between the pixel electrode 231 and the facing electrode 235 and having a multilayer structure, including an emission layer, may be formed on the insulating layer 218. Unlike FIG. 3, a partial layer of the intermediate layer 233 may be a common layer approximately corresponding to the entire surface of the substrate 210, and another partial layer may be a pattern layer patterned to correspond only to the pixel electrode 231. The pixel electrode 231 may be electrically connected to the thin film transistor TFT through a via hole. A pixel defining layer 219 that covers an edge of the pixel electrode 231 and has an opening that defines each pixel area may be formed on the insulating layer 218 to approximately correspond to the entire surface of the substrate 210.

In this regard, the thin film transistor TFT is manufactured by using the method described above. That is, the polycrystalline silicon layer in each thin film transistor TFT may be one of the plurality of islands formed in accordance with FIGS. 1-2 described previously, i.e., correspond to the first or second islands. Further, since the first islands LC are randomly located throughout the substrate 210, thin film transistors TFT corresponding to the first islands LC may also be randomly located throughout the substrate 210. Thus, when a same electrical signal is applied to all the thin film transistors TFT located in a display area of the organic light-emitting display apparatus, the random distribution of the thin film transistors TFT corresponding to the first islands LC may minimize noticeability of corresponding weaker electrical signals in the thin film transistors TFT. Accordingly, a high quality image having no image stain as a whole may be formed by organic light-emitting devices OLED electrically connected to the thin film transistors TFT.

In the meantime, not all of the islands shown in FIG. 2 are used as semiconductor layers of the thin film transistors TFT. For example, some of the islands may be used as an electrode of the capacitor Cap. Thus, the plurality of pixel electrodes 231 may correspond to at least a part of the islands shown in FIG. 2.

Embodiments are not limited to the organic light-emitting display apparatus. For example, a display apparatus including a thin film transistor that includes a polycrystalline silicon layer as an active layer, e.g., a liquid crystal display apparatus, may be within the scope of the embodiments.

Embodiments also include a method of manufacturing a display apparatus that is the same as the method of manufacturing the organic light-emitting display apparatus. That is, a display apparatus, e.g., an organic light-emitting display apparatus, may be manufactured by performing a process of manufacturing the thin film transistor substrate by using the method of manufacturing the thin film transistor substrate described above, and a process of forming a plurality of pixel electrodes corresponding to polycrystalline silicon layers.

As described above, according to the one or more of the above embodiments, a method of manufacturing a thin film transistor substrate including a plurality of thin film transistors having uniform characteristics, a method of manufacturing a display apparatus, a thin film transistor substrate, and a display apparatus may be implemented.

By way of summation and review, a drawback of a conventional thin film transistor is that a plurality of thin film transistors may not have uniform characteristics. This means that the thin film transistors in a display area of a conventional display apparatus may not have uniform characteristics. As a result, even if the same electrical signal is applied to the plurality of thin film transistors in a same display area of the conventional display apparatus, the thin film transistors may not operate uniformly due to the non-uniform characteristics. Accordingly, an image may not be displayed correctly.

In contrast, example embodiments include a method of manufacturing a thin film transistor substrate that includes randomly distributed thin film transistors with different characteristics among a plurality of thin film transistors with uniform characteristics. As such, the random distribution enables a user to recognize, e.g., optically perceive, the generally uniform characteristics of the plurality of thin film transistors, despite the randomly placed thin film transistors with the different characteristics. A method of manufacturing a display apparatus, a thin film transistor substrate, and a display apparatus are also included.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A method of manufacturing a thin film transistor substrate, the method comprising:
   forming an amorphous silicon layer on a substrate, the substrate having a rectangular shape; and
   irradiating the amorphous silicon layer with a laser beam, such that the amorphous silicon layer crystallizes into a polycrystalline silicon layer,
   wherein the laser beam has a major axis and a minor axis, the major axis being non-parallel with respect to sides of the substrate, and
   wherein irradiating the amorphous silicon layer with the laser beam includes having the laser beam move along first through nth parallel lines, such that distances between adjacent lines of the first through nth parallel lines define a random horizontal distance, n being a natural number.

2. The method as claimed in claim 1, wherein the first through nth straight lines define a first edge of the laser beam at different positions relative to the substrate, the first through nth straight lines being non-parallel to sides of the substrate, and parallel to each other.

3. The method as claimed in claim 2, further comprising patterning the polycrystalline silicon layer to form a plurality of islands spaced apart from each other, such that first islands among the plurality of islands that overlap the first through nth straight lines have different electrical characteristics relative to second islands among the plurality of islands that do not overlap the first through nth straight lines.

4. A method of manufacturing a display apparatus, the method comprising:
   forming an amorphous silicon layer on a substrate, the substrate having a rectangular shape;
   irradiating the amorphous silicon layer with a laser beam, such that the amorphous silicon layer crystallizes into a polycrystalline silicon layer, the laser beam having a major axis and a minor axis, and the major axis being at an oblique angle with respect to sides of the substrate; and
   forming a plurality of pixel electrodes corresponding to the polycrystalline silicon layer,
   wherein irradiating the amorphous silicon layer with the laser beam includes having the laser beam move along first through nth parallel lines, such that distances between adjacent lines of the first through nth parallel lines define a random horizontal distance, n being a natural number.

* * * * *